United States Patent
Woods et al.

(10) Patent No.: US 7,671,114 B2
(45) Date of Patent: Mar. 2, 2010

(54) ADHESIVE OF SUBSTITUTED OXIRANE OR OXETANE COMPOUND WITH SILVER-BASED, LEAD-FREE SOLDER

(75) Inventors: John G. Woods, Farmington, CT (US); Yuhshi Lu, Orange, CT (US); Bruce C. B. Chan, Chino Hills, CA (US); Philip T. Klemarczyk, Canton, CT (US); Andrew D. Messana, Newington, CT (US)

(73) Assignee: Henkel Corporation, Rocky Hill, CT (US)

( * ) Notice: Subject to any disclaimer, the term of this patent is extended or adjusted under 35 U.S.C. 154(b) by 0 days.

(21) Appl. No.: 12/176,729

(22) Filed: Jul. 21, 2008

(65) Prior Publication Data

US 2009/0018239 A1    Jan. 15, 2009

Related U.S. Application Data (62) Division of application No. 11/003,661, filed on Dec. 3, 2004, now abandoned.

(60) Provisional application No. 60/538,463, filed on Jan. 26, 2004.

(51) Int. Cl.
 *C08K 3/08*  (2006.01)
 *C08L 63/00*  (2006.01)
 *C08L 71/00*  (2006.01)

(52) U.S. Cl. .............. 523/458; 525/481; 525/485; 525/486; 525/488; 525/523; 525/524; 525/529; 525/530; 525/531; 525/534

(58) Field of Classification Search .............. None
See application file for complete search history.

(56) References Cited

U.S. PATENT DOCUMENTS

| | | | |
|---|---|---|---|
| 3,644,431 A | 2/1972 | Heer et al. | 549/557 |
| 4,477,629 A | 10/1984 | Hefner, Jr. | 525/113 |
| 5,354,939 A | 10/1994 | Hollstein et al. | 523/206 |
| 5,447,988 A | 9/1995 | Dershem et al. | 524/780 |
| 5,789,482 A | 8/1998 | Eldin et al. | 525/65 |
| 5,872,163 A | 2/1999 | Hollstein et al. | 523/216 |
| 6,084,035 A | 7/2000 | Miyake et al. | 525/438 |
| 6,117,944 A | 9/2000 | Nishikubo et al. | 525/109 |
| 6,365,644 B1 | 4/2002 | Yamamura et al. | 522/168 |
| 6,365,760 B1 | 4/2002 | Kuriyama et al. | 549/510 |
| 6,627,683 B1 | 9/2003 | Klemarczyk et al. | 523/457 |
| 2004/0087687 A1 | 5/2004 | Yang | 523/451 |

FOREIGN PATENT DOCUMENTS

| | | |
|---|---|---|
| CA | 2002977 A | 5/1990 |
| CH | 536833 A | 6/1973 |
| JP | 8-283379 A | 10/1996 |
| JP | 10-152554 A | 6/1998 |
| JP | 11-60683 A | 3/1999 |
| JP | 2000-169552 A | 6/2000 |
| JP | 2001-228610 A | 8/2001 |

*Primary Examiner*—Robert Sellers
(74) *Attorney, Agent, or Firm*—Steven C. Bauman (57) ABSTRACT

In accordance with the present invention, it has now been found that glycidyl epoxy resins containing substitution on the epoxide ring can be used with conventional epoxy curing agents and fluxing agents to produce underfill adhesives that are suitable for use with silver-based alloys. Owing to the structural similarity of the new materials to conventional epoxy resins, physical and material properties of the invention formulations are altered little, if at all, relative to products currently in use, and so are highly compatible with existing processes.

20 Claims, 5 Drawing Sheets

ADHESIVE OF SUBSTITUTED OXIRANE OR OXETANE COMPOUND WITH SILVER-BASED, LEAD-FREE SOLDER

CROSS REFERENCE TO RELATED APPLICATIONS

This application is a division of U.S. patent application Ser. No. 11/003,661 filed Dec. 3, 2004, abandoned, which claims the benefit of an earlier filing date from U.S. Provisional Application No. 60/538,463 filed Jan. 26, 2004.

FIELD OF THE INVENTION

The present invention relates to epoxy compounds, formulations containing same, and uses therefore.

BACKGROUND OF THE INVENTION

Epoxy resin-based fluxing underfill adhesives are widely used for the assembly of solder-bumped flip-chip devices. As these assemblies are heated in the region of 180-220° C. to reflow or melt the solder, the fluxing agent component of the adhesive cleans and removes oxides from solder surface promoting self-alignment, electrical connectivity and mechanical attachment of the chip to the substrate. During this process, the bumped chip is observed to undergo a controlled collapse as solder wets the contact pads located on the substrate surface and a solder joint is formed. To facilitate this process, it is important that curing of the epoxy be kept to a minimum until device collapse has occurred. Thereafter, it is desirable that curing be completed as quickly as possible.

Current epoxy formulations have been optimized for this process which generally employs lead-based solder alloys. However, due to toxicity and environmental concerns, no-lead solders, based on silver alloys, have been developed. These alloys typically melt at temperatures that are significantly higher than lead-based materials (i.e., 210-250° C.) and therefore fluxing formulations designed for lead-based processes are ineffective with silver-based alloys. The higher temperatures of the lead-free alloys cause significant curing of the adhesive compositions prior to and during fluxing and solder melting. As a result, device collapse and electrical connectivity are seriously compromised.

A need exists therefore, for fluxing adhesive formulations in which the onset of curing occurs at substantially higher temperatures than is possible with current epoxy systems, but yet retains other desirable features of the existing formulations.

SUMMARY OF THE INVENTION

In accordance with the present invention, it has now been found that glycidyl epoxy resins containing substitution on the epoxide ring can be used with conventional epoxy curing agents and fluxing agents to produce underfill adhesives that are suitable for use with silver-based alloys. Owing to the structural similarity of the new materials to conventional epoxy resins, physical and material properties of the invention formulations are altered little, if at all, relative to products currently in use, and so are highly compatible with existing processes.

DETAILED DESCRIPTION OF THE INVENTION

In accordance with the present invention, there are provided adhesive compositions comprising at least one substituted oxirane or substituted oxetane compound, as described herein, and one or more polymerizable co-reactants. Invention adhesive compositions are useful in a variety of applications, e.g., for high temperature applications with silver-based, lead-free solders, in applications where the reaction products of said composition are re-workable, in applications where the reaction products of said composition are thermally reworkable, and the like.

Substituted oxirane and substituted oxetane compounds contemplated for use in the practice of the present invention comprise the structure:

$$\text{E-CH}_2\text{-Q-X}_p\text{—Y—Z}_m\text{—Y}_n\text{—X}_p\text{-Q-CH}_2\text{-E}$$

wherein:

each E is independently an oxirane bearing 1, 2, or 3 additional substituents other than H or an oxetane bearing 1, 2, or 3 additional substituents other than H, each Q is independently selected from the group consisting of —O— and —S—, each X is optional, and when present, is independently selected from —C(O)—, and —SO$_2$—, each Y, when present, is independently an optionally substituted hydrocarbylene,

Z is optional, and when present is selected from the group consisting of —O—, —C(O)—, —S—, —SO$_2$—, hydrocarbylene, substituted hydrocarbylene, and combinations of any two or more thereof, m=0 or 1, n=0 or 1, and each p is independently 0 or 1.

Oxiranes contemplated for use in the practice of the present invention typically have the structure:

wherein:

each of $R^1$-$R^3$ is independently selected from the group consisting of hydrogen, alkyl, substituted alkyl, aryl, and substituted aryl, provided, however, that at least one of $R^1$-$R^3$ is not hydrogen.

Exemplary oxiranes contemplated for use in the practice of the present invention include those where $R^1$ of the above structure is —$CH_3$, —$CH_2CH_3$, or the like, and each of $R^2$ and $R^3$ are H; each of $R^1$ and $R^3$ of the above structure are H and $R^2$ is —$CH_3$, —$CH_2CH_3$, or the like; each of $R^1$ and $R^2$ of the above structure are independently —$CH_3$, —$CH_2CH_3$, or the like, and $R^3$ is H; and the like.

In one particular aspect of the invention, it is preferred that each of $R^1$ and $R^3$ of the above structure are H and $R^2$ is —$CH_3$. In another aspect of the invention, it is preferred that $R^1$ of the above structure is H and each of $R^2$ and $R^3$ are —$CH_3$.

Oxetanes contemplated for use in the practice of the present invention typically have the structure:

wherein:

$R^4$ is selected from the group consisting of alkyl, substituted alkyl, aryl, and substituted aryl.

Exemplary oxetanes contemplated for use in the practice of the present invention include those where $R^4$ of the structure presented above is —$CH_3$, —$CH_2CH_3$, —$C_6H_5$, and the like.

In one particular aspect of the present invention, it is preferred that $R^4$ of the structure presented above is —$CH_3$.

As employed herein, "alkyl" refers to hydrocarbyl radicals having 1 up to about 20 carbon atoms, preferably 2-10 carbon atoms. "Lower alkyl" refers to alkyl groups having in the range of 1 up to about 5 carbon atoms. "Substituted alkyl" refers to alkyl groups further bearing one or more substituents selected from alkoxy, cycloalkyl, substituted cycloalkyl, heterocyclic, substituted heterocyclic, aryl, substituted aryl, heteroaryl, substituted heteroaryl, aryloxy, substituted aryloxy, halogen, cyano, nitro, amido, C(O)H, acyl, oxyacyl, carboxyl, carbamate, sulfonyl, sulfonamide, sulfuryl, and the like.

As employed herein, "alkoxy" refers to the moiety —O-alkyl, wherein alkyl is as defined above, and "substituted alkoxy" refers to alkoxy groups further bearing one or more substituents as set forth above.

As employed herein, "cycloalkyl" refers to cyclic ring-containing groups containing in the range of 3 up to about 8 carbon atoms, and "substituted cycloalkyl" refers to cycloalkyl groups further bearing one or more substituents as set forth above.

As employed herein, "aryl" refers to aromatic groups having in the range of 6 up to about 14 carbon atoms and "substituted aryl" refers to aryl groups further bearing one or more substituents as set forth above.

As employed herein, "aryloxy" refers to the moiety —O-aryl, wherein aryl is as defined above, and "substituted aryloxy" refers to aryloxy groups further bearing one or more substituents as set forth above.

As employed herein, "alkylaryl" refers to alkyl-substituted aryl groups and "substituted alkylaryl" refers to alkylaryl groups further bearing one or more substituents as set forth above.

As employed herein, "arylalkyl" refers to aryl-substituted alkyl groups and "substituted arylalkyl" refers to arylalkyl groups further bearing one or more substituents as set forth above.

As employed herein, "arylalkenyl" refers to aryl-substituted alkenyl groups and "substituted arylalkenyl" refers to arylalkenyl groups further bearing one or more substituents as set forth above.

As employed herein, "alkenylaryl" refers to alkenyl-substituted aryl groups and "substituted alkenylaryl" refers to alkenylaryl groups further bearing one or more substituents as set forth above.

As employed herein, "arylalkynyl" refers to aryl-substituted alkynyl groups and "substituted arylalkynyl" refers to arylalkynyl groups further bearing one or more substituents as set forth above.

As employed herein, "alkynylaryl" refers to alkynyl-substituted aryl groups and "substituted alkynylaryl" refers to alkynylaryl groups further bearing one or more substituents as set forth above.

As employed herein, "heteroaryl" refers to aromatic groups having in the range of 2 up to 20 carbon atoms and one or more heteroatoms (e.g. N, O, S, or the like) as part of the ring structure, and "substituted heteroaryl" refers to heteroaryl groups further bearing one or more substituents as set forth above.

As employed herein, "heterocyclic" refers to cyclic (i.e. ring containing) groups containing one or more heteroatoms (e.g. N, O, S, or the like) as part of the ring structure, and having in the range of 3 up to 20 carbon atoms, and "substituted heterocyclic" refers to heterocyclic groups further bearing one or more substituents as set forth above. Exemplary heterocyclic moieties include saturated rings, unsaturated rings, and aromatic heteroatom-containing ring systems, e.g., epoxy, tetrahydrofuran, oxazoline, oxazine, pyrrole, pyridine, furan, and the like.

As employed herein, "hydrocarbylene" refers to divalent straight or branched chain hydrocarbyl groups including alkylene groups, alkenylene groups, alkynylene groups, cycloalkylene groups, heterocycloalkylene groups, arylene groups, heteroarylene groups, alkylarylene groups, arylalkylene groups, arylalkenylene groups, arylalkynylene groups, alkenylarylene groups, alkynylarylene groups, and the like; and "substituted hydrocarbylene" refers to hydrocarbylene groups further bearing one or more substituents as set forth above.

As employed herein, "alkylene" refers to divalent hydrocarbyl radicals having 1 up to about 20 carbon atoms, preferably 2-10 carbon atoms; and "substituted alkylene" comprises alkylene groups further bearing one or more substituents as set forth above.

As employed herein, "cycloalkylene" refers to divalent cyclic ring-containing groups containing in the range of 3 up to about 8 carbon atoms, and "substituted cycloalkylene" refers to cycloalkylene groups further bearing one or more substituents as set forth above.

As employed herein, "alkenylene" refers to divalent, straight or branched chain hydrocarbyl groups having at least one carbon-carbon double bond, and having in the range of 2 up to about 12 carbon atoms, and "substituted alkenylene" refers to alkenylene groups further bearing one or more substituents as set forth above.

As employed herein, "arylene" refers to divalent aromatic groups having in the range of 6 up to about 14 carbon atoms and "substituted arylene" refers to arylene groups further bearing one or more substituents as set forth above.

As employed herein, "alkarylene" refers to an arylene group bearing an alkyl substituent and "substituted alkarylene" refers to alkarylene groups further bearing one or more substituents as set forth above.

As employed herein, "aralkylene" refers to an alkylene group bearing an aryl substituent and "substituted aralkylene" refers to aralkylene groups further bearing one or more substituents as set forth above.

As employed herein, "oxyalkylene" refers to the moiety —O-alkylene-, wherein alkylene is as defined above, and "substituted oxyalkylene" refers to oxyalkylene groups further bearing one or more substituents as set forth above.

Presently preferred compounds contemplated for use in the practice of the present invention include those where hydrocarbylene is selected from the group consisting of alkylene, alkenylene, alkynylene, cycloalkylene, arylene (e.g., phenylene or naphthylene), and the like, as well as mixtures of any two or more thereof.

In another aspect of the present invention, presently preferred compounds contemplated for use in the practice of the present invention include those where each Q is —O—.

In yet another aspect of the present invention, presently preferred compounds contemplated for use in the practice of the present invention include those where X is —C(O)—.

In still another aspect of the present invention, presently preferred compounds contemplated for use in the practice of the present invention include those where each Y is —$C_6H_4$—.

In a further aspect of the present invention, presently preferred compounds contemplated for use in the practice of the present invention include those where Z is —$C(CH_3)_2$—.

In a still further aspect of the present invention, presently preferred compounds contemplated for use in the practice of the present invention include those where each of m and n is 0, and each E is an oxirane.

In still another aspect of the present invention, presently preferred compounds contemplated for use in the practice of the present invention include those where each of m and n is 1, and each E is an oxirane. In a further aspect of the present invention, presently preferred compounds contemplated for use in the practice of the present invention include those where each of m and n is 1, and each E is an oxetane.

Exemplary co-reactants contemplated for use herein include epoxy (i.e., oxirane), oxetane, anhydride, thiol, amine, imidazole, and the like, including mixtures of any two or more thereof. Presently preferred co-reactants are epoxy.

Exemplary epoxies include, e.g., glycidyl ethers, glycidyl esters, cycloaliphatic epoxides, glycidyl amines, and the like. Presently preferred polymerizable co-reactants contemplated for use in the practice of the present invention include C4-C28 alkyl mono- and di-glycidyl ethers (e.g., butyl glycidyl ether, 2-ethylhexyl glycidyl ether, butanediol diglycidyl ether, neopentyl glycol diglycidyl ether, and the like); C2-C28 alkyl- and alkenyl-glycidyl esters; C1-C28 alkyl-, mono- and polyphenol glycidyl ethers (e.g., phenyl glycidyl ether, cresyl glycidyl ether, bisphenol A diglycidyl ether, bisphenol F diglycidyl ether, diglycidyl ortho-phthalate, diglycidyl para-phthalate, hydrogenated diglycidyl ortho-phthalate, and the like), epoxidized novolac resins, 3,4-epoxycyclohexylmethyl-3,4-epoxycyclohexane carboxylate, aniline diglycidyl ether, and the like.

Invention adhesive compositions optionally further comprise one or more additional polymerizable components, such as, for example, maleimides, vinyl ethers, cyanate esters, (meth)acrylates, styrenes, and the like.

Invention adhesive compositions optionally further comprise at least one polymerization promoter, a filler, toughening agent and/or plasticizer.

As employed herein, the term "polymerization promoter" refers to curing agents, co-curing agents, catalysts, initiators or other additives designed to participate in or promote curing of the adhesive formulation. With respect to epoxide-based adhesive formulations, such polymerization promoters include curing agents and catalysts such as, for example, anhydrides, amines, imidazoles, thiols, carboxylic acids, phenols, dicyandiamide, urea, hydrazine, hydrazide, amino-formaldehyde resins, melamine-formaldehyde resins, amine-boron trihalide complexes, quaternary ammonium salts, quaternary phosphonium salts, tri-aryl sulfonium salts, di-aryl iodonium salts, diazonium salts, and the like. Presently preferred curing agents and catalysts for epoxide-based formulations include anhydrides, amines, imidazoles, and the like. With respect to adhesive formulations comprising crosslinkable derivatives of dicyclopentadiene, such polymerization promoters include curing agents and catalysts such as, for example, free-radical curing agents (e.g., peroxides), hydrosilation agents, polythiols, and the like.

As readily recognized by those of skill in the art, polymerization promoters contemplated for use in the practice of the present invention will vary with the reactive functionality(ies) present, the presence of optional co-reactant(s), and the like. Typically, the quantity of polymerization promoter will fall in the range of about 1 weight % up to about 50 weight % of the total composition, with presently preferred amounts of polymerization promoter falling in the range of about 5 weight % up to about 40 weight % of the total composition.

Initiators contemplated for use with epoxide-based adhesive formulations include hydroxy functionalized compounds such as, for example, alkylene glycols. Preferred alkylene glycols include ethylene glycols and propylene glycols.

Fillers contemplated for optional use in the practice of the present invention may optionally be conductive (electrically and/or thermally). Electrically conductive fillers contemplated for use in the practice of the present invention include, for example, silver, nickel, gold, cobalt, copper, aluminum, graphite, silver-coated graphite, nickel-coated graphite, alloys of such metals, and the like, as well as mixtures thereof. Both powder and flake forms of filler may be used in the adhesive compositions of the present invention. Preferably, the flake has a thickness of less than about 2 microns, with planar dimensions of about 20 to about 25 microns. Flake employed herein preferably has a surface area of about 0.15 to 5.0 m2/g and a tap density of about 0.4 up to about 5.5 g/cc. It is presently preferred that powder employed in the practice of the invention has a diameter of about 0.5 to 15 microns. If present, the filler typically comprises in the range of about 30% up to about 70% by weight of the adhesive formulation.

Thermally conductive fillers contemplated for optional use in the practice of the present invention include, for example, aluminum nitride, boron nitride, silicon carbide, diamond, graphite, beryllium oxide, magnesia, silica, alumina, and the like. Preferably, the particle size of these fillers will range from about 5 nm up to about 20 microns. If aluminum nitride is used as a filler, it is preferred that it be passivated via an adherent, conformal coating (e.g., silica, or the like).

Electrically and/or thermally conductive fillers are optionally (and preferably) rendered substantially free of catalytically active metal ions by treatment with chelating agents, reducing agents, nonionic lubricating agents, or mixtures of such agents. Such treatment is described in U.S. Pat. No. 5,447,988, which is incorporated by reference herein in its entirety.

Optionally, a filler may be used that is neither an electrical nor thermal conductor. Such fillers may be desirable to impart some other property to the adhesive formulation such as, for example, reduced thermal expansion of the cured adhesive, reduced dielectric constant, improved toughness, increased hydrophobicity, and the like. Examples of such fillers include perfluorinated hydrocarbon polymers (i.e., TEFLON™), thermoplastic polymers, thermoplastic elastomers, mica, fumed silica, fused silica, glass powder, and the like.

Toughening agents contemplated for optional use in the practice of the present invention are reactive moieties modified to include an elastomeric component, thereby imparting resilience to the resulting formulation. Examples of such materials include epoxy-modified rubbers such as EPON resins, available from Resolution Performance Products (Houston, Tex.).

Flexibilizers (also called plasticizers) contemplated for optional use in the practice of the present invention include branched polyalkanes or polysiloxanes that lower the Tg of the formulation. Such flexibilizers include, for example, polyethers, polyesters, polythiols, polysulfides, and the like. If used, flexibilizers typically are present in the range of about 0.5% up to about 30% by weight of the formulation.

Dyes contemplated for optional use in the practice of the present invention include nigrosine, Orasol blue GN, phthalocyanines, and the like. When used, organic dyes in relatively low amounts (i.e., amounts less than about 0.2% by weight) provide contrast.

Pigments contemplated for optional use in the practice of the present invention include any particulate material added solely for the purpose of imparting color to the formulation, e.g., carbon black, metal oxides (e.g., $Fe_2O_3$, titanium oxide), and the like. When present, pigments are typically present in the range of about 0.5 up to about 5 weight %, relative to the weight of the base formulation.

The decomposition of conventional epoxide-based thermoset adhesives generally occurs at temperatures in excess of 300° C. and these materials are therefore unsuitable for use in reworkable applications. In reworkable applications, commercial specifications state that cured adhesives withstand solder reflow temperatures without significant decomposition, i.e. at temperatures up to about 200° C. At the same time, the adhesives undergo rapid degradation at temperatures in the range of about 200 up to about 260° C.

In accordance with yet another embodiment of the present invention, there are provided fluxing adhesive formulations having elevated curing onset temperature, the formulations comprising:
  at least one substituted oxirane or substituted oxetane compound, as described herein,
  a curing agent,
  a fluxing agent, and
  optionally, a catalyst.

In accordance with still another embodiment of the present invention, there are provided methods for increasing the curing onset temperature of a fluxing adhesive formulation, the method comprising incorporating an amount of at least one substituted oxirane or substituted oxetane compound, as described herein, into the formulation effective to raise the curing onset temperature of the fluxing adhesive formulation.

In accordance with a further embodiment of the present invention, there are provided methods for adhesively attaching a device to a substrate, the methods comprising dispensing an adhesive composition as described herein onto a substrate and/or a device or between the substrate and the device to form an assembly, and exposing the assembly to conditions sufficient to cure the adhesive.

Conditions suitable to cure invention adhesive compositions comprise subjecting invention adhesive compositions, when used for no-lead reflow, to a temperature of at least about 120° C. but less than about 190° C. for about 0.5 up to about 60 minutes. This rapid, short duration heating can be accomplished in a variety of ways, e.g., with an in-line heated rail, a belt furnace, a curing oven, or the like. When invention compositions are subjected to thermal reworking, temperatures in the range of about 90° C. up to about 180° C. are typically used.

In accordance with yet another embodiment of the present invention, there are provided methods for removing adhesively attached devices from a substrate, the method comprising exposing a cured aliquot of adhesive compositions described herein positioned between the substrate and the device to temperatures in the range of about 200° C. up to about 260° C., and removing the device from the substrate.

In accordance with still another embodiment of the present invention, there are provided methods for adhesively attaching a first article to a second article, the method comprising:
  (a) applying an invention composition as described herein to the first article,
  (b) bringing the first and second article into intimate contact to form an assembly wherein the first article and the second article are separated only by the adhesive composition applied in step (a), and thereafter
  (c) subjecting the assembly to conditions suitable to cure the adhesive composition.

In accordance with a still further embodiment of the present invention, there are provided assemblies produced by the above-described methods.

In accordance with yet another embodiment of the present invention, there are provided assemblies comprising a first article reversibly adhered to a second article by cured reaction products of the adhesive compositions described herein.

Those of skill in the art recognize that many different electronic packages would benefit from preparation using the invention compositions described herein. Examples of such packages include ball grid arrays, super ball grid arrays, IC memory cards, chip carriers, hybrid circuits, chip-on-board, multi-chip modules, pin grid arrays, chip size packages (CSPs), and the like.

In accordance with still another embodiment of the present invention, there are provided substituted oxirane and substituted oxetane compounds comprising the structure:

wherein:
  each E is independently an oxirane bearing 1, 2, or 3 additional substituents other than H or an oxetane bearing 1, 2, or 3 additional substituents other than H,
  each Q is independently selected from the group consisting of —O—, and —S—,
  each X is optional, and when present, is independently selected from —C(O)—, and —SO$_2$—,
  each Y, when present, is independently an optionally substituted hydrocarbylene, Z is optional, and when present is selected from the group consisting of —O—, —C(O)—, —S—, —SO$_2$—, hydrocarbylene, and substituted hydrocarbylene, and combinations of any two or more thereof, m=0 or 1 when E is an oxirane, and m=1 when E is an oxetane, n=0 or 1 when E is an oxirane, and n=1 when E is an oxetane, and each p is independently 0 or 1, provided, however, when m and n are each 1, and each p is 0, and each E is an oxirane, and each Q is —O—, and neither X is present, and each Y is phenylene, and Z is —C(CH$_3$)$_2$—, then only one E can be monomethyl substituted.

In accordance with another embodiment of the present invention, there are provided diepoxy monomers comprising at least one di-, tri- or tetra-substituted oxirane substituent and/or at least one monosubstituted oxetane substituent, and an optionally substituted glycidyl ether group which when cured provides compositions with superior performance properties, e.g., the ability to form formulations which are reworkable through thermal decomposition, the ability to form formulations which are useful for high temperature applications with silver-based, lead-free solders, and the like.

In accordance with yet another embodiment of the present invention, there are provided diaryl substituted diepoxy ether monomers comprising at least on di-, tri- or tetra-substituted oxirane substituent and/or at least one monosubstituted oxetane substituent, wherein said monomers, when cured, provide compositions with superior performance properties, e.g., the ability to form formulations which are reworkable through thermal decomposition, the ability to form formulations which are useful for high temperature applications with silver-based, lead-free solders, and the like.

The invention will now be described in greater detail by reference to the following non-limiting examples.

Example 1

Synthesis of
2,2-bis[4-(2,3-epoxybutoxy)phenyl]propane
(ECE-BPA: epoxidized crotyl ether of bisphenol A)

1.(a) Synthesis of intermediate 2,2-bis[4-(but-2-enyloxy)phenyl]propane (dicrotyl ether bisphenol A; DCE-BPA)

To a 1 L-reaction flask fitted with a mechanical stirrer, heating mantle, addition funnel and thermocouple was added 50% sodium hydroxide solution (400 mL; ~5 moles) and tetrabutylammonium hydrogensulfate (16.88 g; 0.05 moles). The mixture was stirred and bisphenol A (100.27 g; 0.44 moles) was added portionwise over 40 minutes, during which time the temperature increased to 30° C. The mixture was heated to 85° C. and stirred for 1 hour. Crotyl chloride (89.60 g; 0.99 moles) was added dropwise over 20 minutes while the reaction temperature was maintained in the range 85-90° C. Stirring and heating (80° C.) were continued for a further 16 hours. The mixture was cooled, poured onto 400 g of ice and extracted with dichloromethane (2×400 mL). The combined extracts were washed with sodium chloride solution (2×400 mL), dried over sodium sulfate, filtered and the solvent removed under reduced pressure to give a viscous liquid (151.63 g). The liquid product was treated on a wiped film evaporator (80° C., 0.4-1.0 torr, 60 RPM, 1 mL/minute) to yield DCE-BPA (142.74 g; 96%) as a viscous liquid. The structure of the product was confirmed by spectral analyses.

$^1$H NMR (CDCl$_3$; 300 MHz): δ 1.60, s, 6H [C(CH$_3$)$_2$]; δ 1.80, d, 6H [CH$_3$—CH=]; δ 4.40-4.60, m, 4H [OCH$_2$CH=]; δ 5.6-6.0, m, 4H [—CH=CH—]; δ 6.8-7.2, m, 8H [Ar—H]. IR (NaCl film): 964 cm$^{-1}$ (olefin).

1.(b) Epoxidation of
2,2-bis[4-(but-2-enyloxy)phenyl]propane

To a 2 L-reaction flask fitted with a mechanical stirrer, cooling bath containing salt/ice mixture, addition funnel, nitrogen inlet and thermocouple was added 2,2-bis[4-(but-2-enyloxy)phenyl]propane (DCE-BPA; prepared by the method described in Example 1a) (177 g; 0.53 moles) and dichloromethane (800 mL). The mixture was stirred to dissolve the DCE-BPA and cooled to 4° C. 3-chloroperoxybenzoic acid (276 g, 1.6 moles) was added portionwise to the cooled solution over 30 minutes while maintaining the reaction temperature below 5° C. After the addition was complete the mixture was stirred for a further 5 hours at 3-5° C. and then slowly allowed to warm to room temperature over 16 hours. The mixture was filtered and the filtrate washed with 10% sodium sulfite solution (2×400 mL) followed by saturated sodium bicarbonate solution (2×400 mL). The washed solution was dried over sodium sulfate, filtered and the solvent removed under reduced pressure to give the crude epoxy monomer as a viscous liquid. The liquid monomer was further treated on a wiped film evaporator, as described in Example 1(a), to yield 2,2-bis[4-(2,3-epoxybutoxy)phenyl] propane (ECE-BPA) (167.93 g; 87%) as a waxy solid. The structure of the monomer was confirmed by spectral analyses.

$^1$H NMR (CDCl3; 300 MHz): δ 1.40, d, 6H [CH$_3$—CH—O]; δ 1.60, s, 6H [C(CH$_3$)$_2$]; δ 3.00-3.40, m, 4H [CHOCH]; δ 4.00-4.20, m, 4H [OCH$_2$CHO]; δ 6.8, 7.2, m, 8H [Ar—H]. IR (NaCl film): 872 cm$^{-1}$ (epoxide).

Example 2

Synthesis of 2,2-bis[4-(2,3-epoxy-3-methylbutoxy)phenyl]propane (EDA-BPA: epoxidized dimethylallyl ether of bisphenol A)

2.(a) Synthesis of intermediate 2,2-bis[4-(3-methylbut-2-enyloxy)phenyl]propane (bis-3,3-dimethylallyl ether bisphenol A; BDM-BPA)

To a 1 L-reaction flask fitted with a mechanical stirrer, heating mantle, addition funnel and thermocouple was added 50% sodium hydroxide solution (200 mL; 2.50 moles) and tetrabutylammonium hydrogensulfate (8.40 g; 0.025 moles). The mixture was stirred and bisphenol A (50.00 g; 0.220 moles) was added portionwise over 10 minutes, during which time the temperature increased to 48° C. The milky-white mixture was heated to 80° C. and 1-chloro-2-methyl-3-butene (48.73 g; 0.466 moles) was added dropwise over 20 minutes during which the temperature was maintained between 80° C. and 90° C. Stirring and heating (80° C.) were continued for a further 16 hours. The mixture was cooled, poured onto 200 g of ice and extracted with dichloromethane (2×200 mL). The combined extracts were washed with sodium chloride solution (2×200 mL), dried over sodium sulfate, filtered and the solvent removed under reduced pressure to give a viscous liquid (73 g). The liquid product was treated on a wiped film evaporator to remove trace amounts of volatile residues (80° C., 0.4-1.0 torr, 60 RPM, 1 mL/minute) and yielded BDM-BPA (70 g; 88%) as a viscous liquid. The structure of the product was confirmed by spectral analyses.

$^1$H NMR (CDCl3; 300 MHz): δ 1.60, s, 6H [C(CH$_3$)$_2$]; δ 1.75, 1.85, s, 6H [(CH$_3$)$_2$—C=]; δ 4.50, d, 4H [OCH$_2$CH=]; δ 5.55, t, 2H [—CH=C]; δ 6.8-7.2, m, 8H [Ar—H]. IR (NaCl film): 825 cm$^{-1}$ (olefin).

2.(b) Epoxidation of 2,2-bis[4-(3-methylbut-2-enyloxy)phenyl]propane To a 2 L-reaction flask fitted with a mechanical stirrer, cooling bath containing salt/ice mixture, addition funnel, nitrogen inlet and thermocouple was added 2,2-bis[4-(3-methylbut-2-enyloxy)phenyl]propane (BDM-BPA, prepared as described in Example 2a) (140.3 g; 0.383 moles), and dichloromethane (800 mL). The mixture was stirred to dissolve the BDM-BPA and cooled to 3° C. 3-chloroperoxybenzoic acid (190.40 g, 1.10 moles) was added portionwise to the cooled solution over 30 minutes while maintaining the reaction temperature below 5° C. After the addition was complete the mixture was stirred for a further 5 hours at 3-5° C. and then slowly allowed to warm to room temperature over 16 hours. The mixture was filtered and the filtrate washed with 10% sodium sulfite solution (2×300 mL) followed by saturated sodium bicarbonate solution (2×300 mL). The washed solution was dried over sodium sulfate, filtered and the solvent removed under reduced pressure to give the crude epoxy monomer as a brown-colored viscous liquid. The liquid monomer was further treated on a wiped film evaporator, as described in Example 1 (a), to yield 2,2-bis[4-(2,3-epoxybutoxy)phenyl]propane (EDA-BPA) (114.4 g; 75%) as a viscous liquid. The structure of the monomer was confirmed by spectral analyses.

$^1$H NMR (CDCl3; 300 MHz): δ 1.40, d, 6H [(CH$_3$)$_2$—C—O]; δ 1.65, s, 6H [C(CH$_3$)$_2$]; δ 3.20, t, 2H [CHOC]; δ 4.10, d, 4H [OCH$_2$CH—O]; δ 6.8, 7.2, m, 8H [Ar—H]. IR (NaCl film): 871 cm$^{-1}$ (epoxide).

Example 3

Synthesis of 2,2-bis[4-(3-methyloxetanylmethoxy)phenyl]propane (OXT-BPA)

To a 1 L-reaction flask fitted with a mechanical stirrer, heating mantle, addition funnel, nitrogen inlet and thermocouple was added 50% sodium hydroxide solution (150 mL; 1.88 moles) and tetrabutylammonium hydrogensulfate (6.32 g; 0.02 moles). The mixture was stirred and bisphenol A (37.576 g; 0.165 moles) was added portionwise over 30 minutes. The mixture was then heated to 80° C. for one hour and 3-bromomethyl-3-methyloxetane (53.898 g; 0.327 moles) added dropwise over 30 minutes. The mixture was stirred and heated at 80° C. for an additional 16 hours, cooled, poured onto ice (200 g) and extracted with dichloromethane (2×200 mL). The combined extracts were washed with sodium chloride solution (2×200 mL), dried over sodium sulfate and filtered. The solvent was removed under reduced pressure to give 2,2-bis[4-(3-methyloxetanyl-methoxy)phenyl]propane as a white crystalline product (63.06 g; 97%). The structure of the product was confirmed by spectral analysis.

$^1$H NMR (CDCl$_3$; 300 MHz): δ 1.40, s, 6H [oxetane-CH$_3$]; δ 1.60, s, 6H; [C(CH$_3$)$_2$]; δ 4.00, s, 4H [ArOCH$_2$—]; δ 4.45, 4.55, m, 8H [oxetane-OCH$_2$—]; δ 6.82, 7.18, m, 8H [Ar—H]
IR (NaCl film): 2870 cm$^{-1}$ (gem CH$_3$); 1247 cm$^{-1}$ (acyclic ether); 983 cm$^{-1}$ (cyclic ether).

Example 4

Analysis of Epoxide and Oxetane Monomers of Examples 1-3

The epoxy and oxetane equivalent weights of the monomers prepared as described in Examples 1-3 were determined by potentiometric titration using standardized 0.1N perchloric acid in glacial acetic acid as titrant. The values obtained were compared to the values calculated from the expected structures of the monomers and used to determine the concentrations of curing agents required to obtain optimal material properties. The results are presented in Table 1.

TABLE 1

Epoxide or oxetane equivalent weights for monomers of Examples 1-3

| Example | Monomer | Calculated EW | Measured EW |
| --- | --- | --- | --- |
| 1(b) | ECE-BPA | 184 | 210 (±5) |
| 2(b) | EDA-BPA | 198 | 222 (±1) |
| 3 | OXT-BPA | 198 | 200 (±1) |

In all cases, the observed equivalent weights were found to be close to the values estimated from the monomer structures.

Example 5

Adhesive Formulations and Properties

Adhesive formulations containing the epoxide and oxetane monomers of Examples 1-3 were prepared by blending together the component materials shown in Table 2 (Formulations B, C, D). For comparative purposes, a formulation containing a conventional epoxy monomer, diglycidyl ether bisphenol A (DGE-BPA), was also prepared (Formulation A)

TABLE 2

Composition of adhesive formulations

| | Formulation | | | |
| --- | --- | --- | --- | --- |
| | A | B | C | D |
| DGE-BPA[1] | 48.2 | | | |
| ECE-BPA[2] | | 50.5 | | |
| EDA-BPA[3] | | | 50.1 | |
| OXT-BPA[4] | | | | 49.9 |
| Anhydride 62C[5] | 37.9 | 36.3 | 36.3 | 36.7 |
| Diacid 1550[6] | 12.5 | 12.0 | 12.2 | 12.1 |
| DBU[7] | 0.4 | 0.4 | 0.4 | 0.4 |
| Silane A-187[8] | 1.0 | 0.8 | 1.0 | 0.9 |

[1]DGE-BPA is diglycidyl ether bisphenol A.
[2]ECE-BPA is 2,2-bis[4-(2,3-epoxybutoxy)phenyl]propane.
[3]EDA-BPA is 2,2-bis[4-(2,3-epoxy-3-methylbutoxy)-phenyl]propane (also referred to as epoxidized dimethylallyl ether of bisphenol A).
[4]OXT-BPA is 2,2-bis[4-(3-methyloxetanylmethoxy)-phenyl]propane.
[5]Anhydride 62C is employed as a curing agent. It is a 1:1 blend of hexahydrophthalic anhydride and methylhexahydrophthalic anhydride and is supplied by Lindau Chemicals Inc. under the trade name Lindride 62C.
[6]Diacid 1550 is a liquid monocyclic C21 dicarboxylic acid derived from tall oil fatty acids and supplied by Westvaco Chemicals. It is employed in the above formulations as a fluxing agent.
[7]DBU is 1,8-diazabicylco[5.4.0]undec-7-ene supplied by Air Products and Chemicals Inc. under the trade name Amicure DBU-E. It functions as a catalyst for the epoxy-anhydride curing reaction.
[8]Silane A-187 is γ-glycidoxypropyltrimethoxysilane, an adhesion promoter supplied by Crompton Corporation under trade name Silquest A-187.

Formulations A-C were obtained as clear, homogeneous blends, whereas formulation D was obtained as a suspension of undissolved or partially dissolved oxetane monomer dispersed in a solution of the remaining ingredients. The formulations were adjusted such that the equivalent weight ratio of anhydride to epoxide or oxetane was approximately constant (0.90). Brookfield viscosity measurements were carried out on the freshly prepared Formulations A-C and show that Formulation B containing mono methyl substituted diepoxide ECE-BPA has significantly higher viscosity than either control Formulation A (unsubstituted diepoxide) or Formulation C (dimethyl substituted diepoxide) (Table 3).

TABLE 3

Properties of uncured Formulations A-D

| | Formulation | | | |
| --- | --- | --- | --- | --- |
| | A | B | C | D |
| Anhydride/cyclic ether EW ratio | 0.91 | 0.91 | 0.89 | 0.90 |
| Brookfield viscosity at 25° C. (Pa · s) | 1.14 | 2.37 | 1.20 | — |
| Storage stability at 21° C. (hours) | 16 | 32 | 55 | — |
| Gel Time at 21° C. (days) | 15 | >20 | >20 | — |

Figure 1:
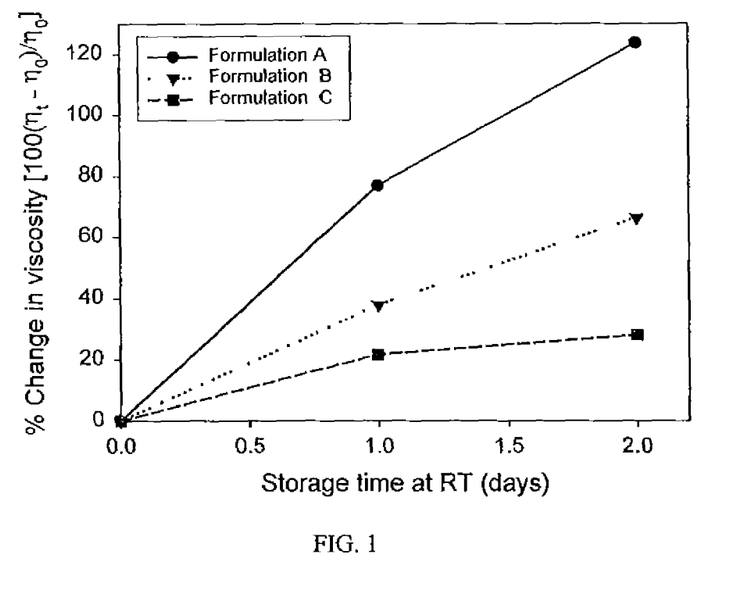
FIG. 1 illustrates the % change in Brookfield viscosity $[100(\eta_t-\eta_0)/\eta_0]$ at 25° C. as a function of storage time at 21° C. $\eta_0$=initial viscosity; $\eta_t$=viscosity after time t. Spindle SC4-21.
Figure 2:
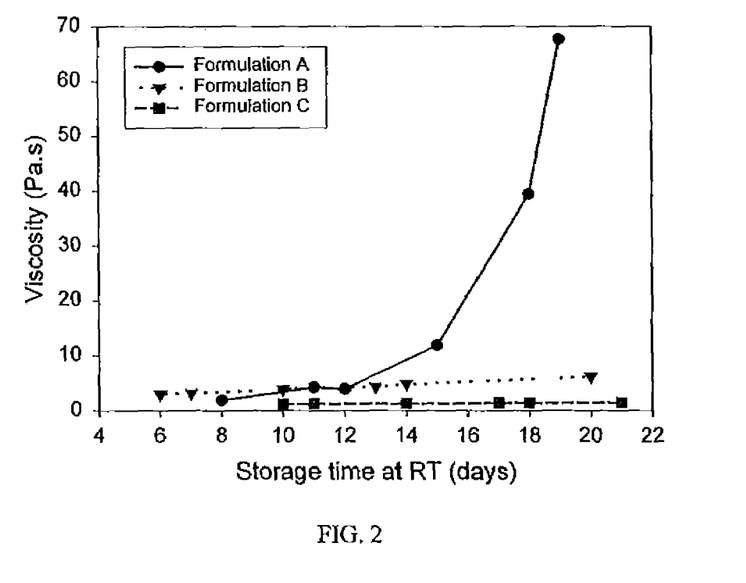
FIG. 2 illustrates the Brookfield viscosity of Formulations A-C (see Example, 5, Table 2). Spindle SC4-28.

The stability of the epoxy Formulations A-C at ambient temperature is limited. Viscosity slowly increases with storage time, which limits the useful lifetime or "pot-life" of the formulated product. The change in viscosity of Formulations A-C during storage under ambient conditions is shown in FIG. 1. Formulations containing epoxy monomers bearing methyl group substituents on the epoxide ring (Formulations B and C) clearly show a lower increase in viscosity compared to the control sample (Formulation A). As the degree of substitution on the epoxide increases, so the pot-life can be extended: dimethyl>monomethyl>hydrogen. A useful measure of the expected storage stability is the time elapsed for the viscosity of the formulation to increase by 50% of its initial value. From the slope of the change in viscosity with time over the first 24 hours, the storage stability of the formulations can be estimated as indicated in Table 3. Storage Stability of Formulation B is Twice that of Control Formulation A, whereas Formulation C has Between 3 to 4 Times the Pot-Life of Control Formulation A It is also clear from FIG. 1 that the rate of viscosity change decreases as the viscosity is increased. When the experiment was conducted over a longer time scale, control Formulation A was observed to gel after approximately 15 days, whereas Formulations B and C containing substituted epoxy monomers showed only modest and negligible increases respectively under the same storage conditions (FIG. 2).

Example 6

Thermal Analysis and Curing of Formulation A-D

Figure 3:
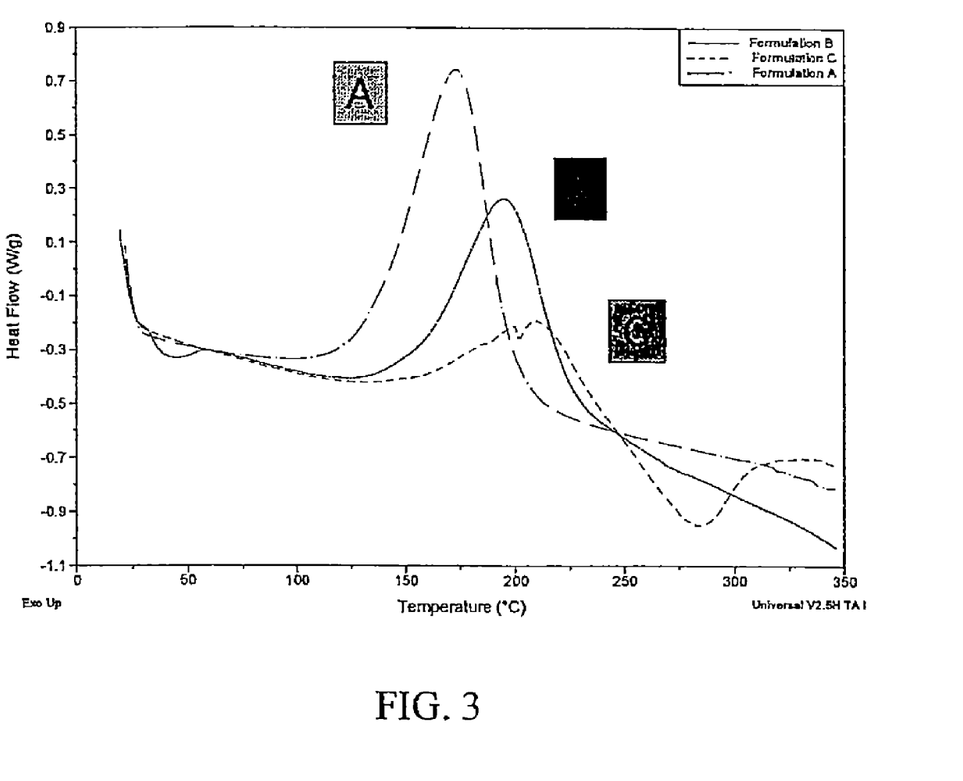
FIG. 3 presents DSC thermograms for Formulations A-C (see Example 5, Table 2). Heating rate=10° C./minute.
Figure 4:
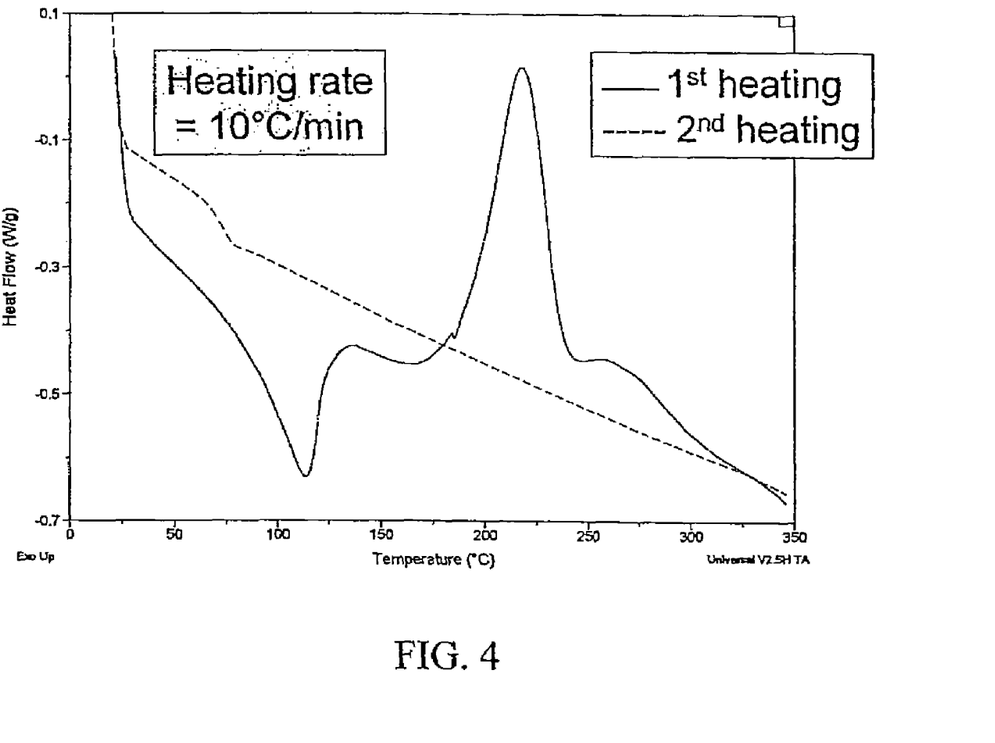
FIG. 4 presents DSC thermograms for Formulation D (see Example 5, Table 2). The first heating shows a melting endotherm for oxetane monomer at 112° C. and a curing exotherm at 219° C. The second heating exhibits an endothermic glass transition at 73° C.

DSC analysis (dynamic scanning calorimetry) was performed on Formulations A-D from ambient temperature to 350° C. at a heating rate of 10° C./minute to determine the polymerization enthalpies and compare the heat sensitivities of the various formulations. The thermograms are shown in FIGS. 3 and 4.

After the first heating, the samples were allowed to cool to ambient temperature and then reheated under the same conditions to determine the enthalpy and glass transition temperature (Tg) of the cured adhesive. The results of DSC analysis for first and second heating are presented in Table 4.

TABLE 4

DSC results for formulation A-D: 23-350° C. at 10° C./min.

| | Formulation | | | |
|---|---|---|---|---|
| | A | B | C | D |
| Onset temperature (° C.) | 117 | 140 | 152 | 167 |
| Peak temperature (° C.) | 157 | 185 | 208 | 219 |
| Temp. at max rate (° C.) | 144 | 165 | 196 | 188 |
| Enthalpy (J/g) | 324 | 238 | 196 | 138 |
| Tg (° C.) | 89 | 60 | ~30 | 73 |

Formulations A, B and C (epoxy monomers) all exhibited single exothermic peaks during the first heating. Formulation C undergoes significant decomposition at temperatures in excess of 250° C. (see below). Formulation D (oxetane monomer) exhibited a large melting endotherm before the onset of curing (FIG. 3), which is attributed to dissolution of oxetane monomer. Endothermic transitions, corresponding to the glass transition temperatures (Tg) of the cured materials, were observed in all cases during the second heating and the absence of exothermic events confirmed that curing was complete in all cases.

This analysis shows that the formulations containing substituted epoxy monomers (Formulations B and C) have higher onset, peak and maximum rate temperatures than the formulation containing the unsubstituted monomer (control Formulation A). It also shows that the value of these parameters increase as the degree of substitution is increased (i.e. values for Formulation C are higher than for Formulation B). In addition the reaction enthalpy is found to decrease with increasing substitution of the epoxy monomer component of the formulations (i.e. enthalpy A>B>C). The results clearly indicate that the formulations containing substituted epoxy monomers are less energetic than formulations containing the unsubstituted material and that reaction rates are retarded as a consequence of the increased substitution.

Increasing the ring size of the epoxide from 3 (oxirane or 1,2-epoxide) to 4 atoms (oxetane or 1,3-epoxide) can also effectively moderate the energy and reactivity of the curing reaction. Formulation D, with oxetane monomer, exhibits higher DSC parameters (onset, peak and max rate temperatures) and lower enthalpy than control Formulation A with corresponding oxirane monomer.

Figure 5:
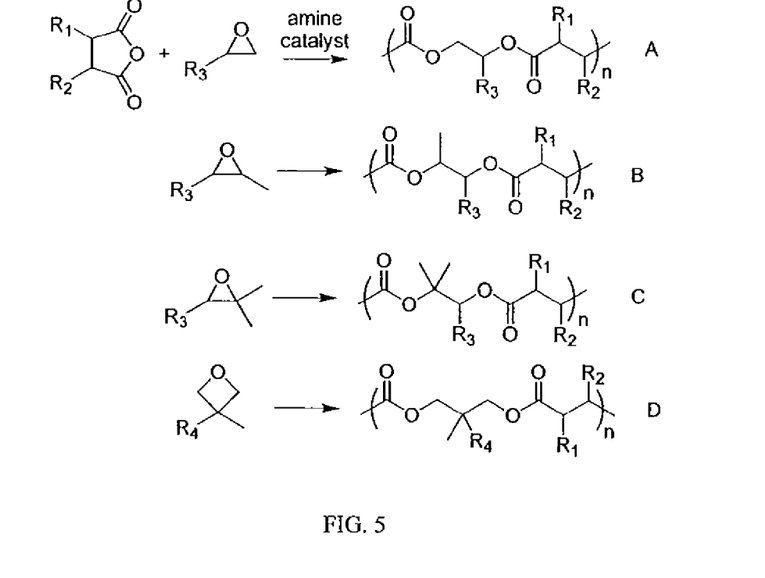
FIG. 5 illustrates repeat unit structures from cyclic anhydride cured cyclic ether monomers where the monomer is (A) unsubstituted epoxide, (B) mono methyl substituted epoxide, (C) dimethyl substituted epoxide, and (D) mono 3-methyl substituted oxetane. $R_1$ and $R_2$ represent substituents on the cyclic anhydride-curing agent and are typically $C_1$-$C_{12}$ alkyl or aryl groups that may be linked to form bicyclic structures.

Glass transition temperatures (Tg) of the cured formulations are however modified by the nature and degree of substitution and the ring size of the epoxide monomer. Control Formulation A, containing unsubstituted epoxide monomer DGE-BBA, gave the highest Tg (89° C.). Formulation B, with 3-methyl substituted epoxy, ECE-BPA, gave a cured product having a Tg value about 30° C. lower (60° C.) and Formulation C with dimethyl substituted epoxide, EDA-BPA, resulted in an even lower Tg. While not wishing to be bound by any mechanism of action, since the observed reductions in Tg are unlikely due to decreased segmental mobility or chain stiffness, they can perhaps be attributed to increased network degradation resulting from thermally induced cleavage of secondary and/or tertiary ester groups in the cured polymer structures. Amine catalyzed anhydride cured epoxides propagate largely through the formation of polyesters in an alternating chain growth mechanism. Thus the main repeat unit structures of the polymers of Formulations A-D differ from one another according to the substitution patterns depicted in FIG. 5. Formulation A polymer is composed of an alternating pattern of primary (1°) and secondary (2°) ester groups; Formulation B polymer is composed only of 2° ester groups and Formulation C polymer is composed of alternating tertiary (3°) and 1° esters.

The Tg of polymer from Formulation D (oxetane monomer) confirms this trend. This polymer is composed only of 1° esters and has a Tg that is significantly higher than its isomeric epoxy analogue (EDA-BPA, Formulation C).

Example 7

Cure Analyses Under Mimicked Reflow Conditions

Figure 6:
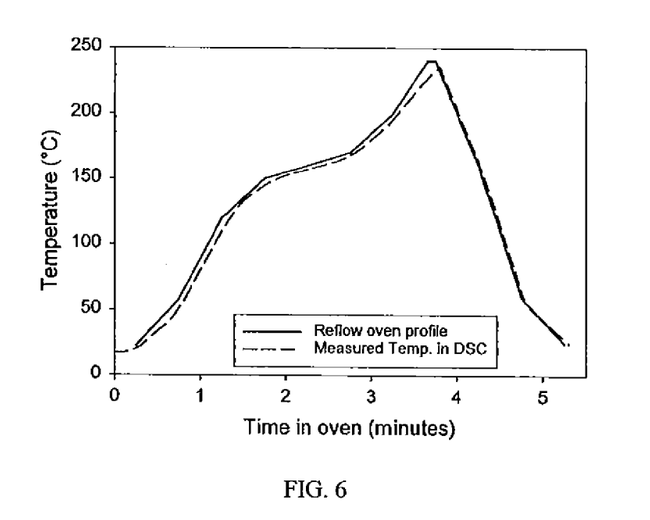
FIG. 6 presents the reflow oven time-temperature profile for silver-based solder alloy (solid line), and the measured temperature in the DSC oven corresponding to the program in Table 5 (dashed line).

The extent of thermal initiated curing in Formulations A-D was determined by DSC analysis under conditions that mimicked the reflow oven temperatures used for silver-based alloys. A typical heat cycle for processing such solders is shown in FIG. 6 (reflow oven profile curve). In order to mimic these heating conditions in the calorimeter, a DSC program corresponding to the heating rates and times listed in Table 5 was utilized. Under these conditions, the measured temperature was found to closely match the profile as shown in FIG. 6 (measured temp. in DSC curve).

The DSC program to mimic the reflow profile was determined experimentally. The oven profile heating rates were averaged over half-minute intervals until the upper temperature limit of 240° C. was reached (3.40 minutes). The temperature was held at 240° C. for a further 0.35 minutes to compensate for a time lag of 0.25 minutes between the programmed and measured temperatures in the DSC oven. Details of the time intervals and corresponding heating rates utilized in the DSC program are presented in Table 5.

TABLE 5

DSC program of heating/cooling rates and times required to mimic reflow oven conditions described in FIG. 6. ΔT represents the change in temperature corresponding to each successive time period.

| Time (mins) | Temp (° C.) | ΔT (° C.) | Rate (° C./min) |
|---|---|---|---|
| 0 | 23 | 0 | 0 |
| 0.5 | 58 | 35 | 70 |
| 1.0 | 120 | 62 | 124 |
| 1.5 | 150 | 30 | 60 |
| 2.0 | 160 | 10 | 20 |
| 2.5 | 170 | 10 | 20 |
| 3.0 | 200 | 30 | 60 |
| 3.4 | 240 | 40 | 80 |
| 3.75 | 240 | 0 | 0 |
| 4.25 | 160 | −80 | −160 |
| 4.75 | 60 | −100 | −200 |
| 5.25 | 25 | −35 | −70 |

In these experiments, heating rates are controlled instrumentally. When the final temperature is reached (3.75 minutes), the sample pan was quickly removed from the DSC oven and placed on an aluminum block that was precooled with a mixture of dry ice and acetone. This ensured rapid cooling and quenching of the curing reaction. The externally measured temperature during cooling was carried out by placing a thermocouple probe in contact with the top surface of the DSC sample pan while it was located on the cooling block. The exact reflow profile will differ from the above example as the composition of the solder alloy is altered.

Figure 7:
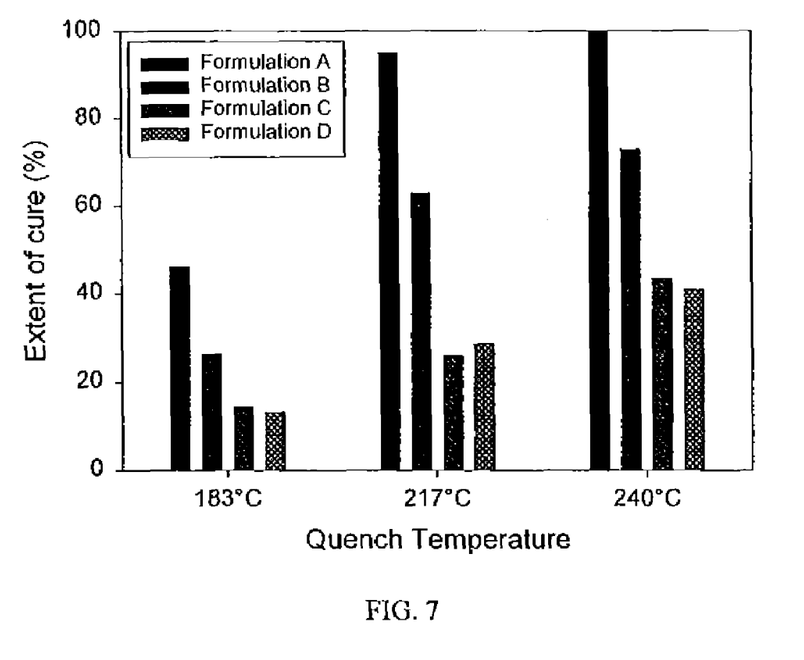
FIG. 7 presents cure conversions of Formulations A-D (see Example 5, Table 2) under reflow oven conditions.

After processing in this manner, the sample was re-analyzed by DSC under standard conditions (10° C./minute, RT to 350° C.) and the residual enthalpy (ΔH$_r$) measured. The % extent of cure was then determined as $(1-\Delta H_r/\Delta H_0)(100)$, where $\Delta H_0$ is the original enthalpy corresponding to full cure as previously measured (Table 4). Similar measurements were also carried out where the upper temperature was held at 183° C. and 217° C. before quenching. The results are presented in FIG. 7.

Fluxing of the solid solder is generally observed in the temperature range 150-180° C. and typical silver-based solder alloys melt in the region of 215-225° C. To ensure good device collapse it is desirable that the extent of curing be kept to a minimum below this temperature range. However, once collapse has occurred it is desirable that curing be completed as soon as possible thereafter.

Three critical and distinct stages can therefore be identified in this process viz. fluxing, solder melting and adhesive curing. For evaluation purposes the extent of curing was determined relative to each of these stages: i.e. at 183° C. after fluxing is complete; at 217° C. after solder melting has commenced and after the maximum temperature of 240° C. has been attained. Curing results demonstrate that Formulation A containing conventional unsubstituted epoxy monomer, DGE-BPA, is 50% cured at 183° C. and almost completely cured before solder melting at 217° C. This product is clearly unsuitable for Ag-based solder bumped devices; indeed, formulations containing such monomers frequently exhibit poor device collapse as a consequence of early onset of curing. In contrast, Formulations B-D containing substituted epoxides and oxetane monomers show retarded curing at all temperatures, indicating that these materials are more suitable for use with high-temperature solders.

Example 8

Control of Curing by Using Monomer Blends

From the above results it is clear that formulations containing substituted epoxide and oxetane monomers exhibit retarded curing compared to a similar formulation prepared with an unsubstituted epoxide. However in certain cases it may be desirable to more precisely control the onset of curing or the extent of curing during the reflow process. To evaluate the properties and cure characteristics of a blended composition, Formulation A/B (Table 6) was prepared using equivalent amounts of substituted monomer ECE-BPA and unsubstituted monomer DGE-BPA.

TABLE 6

Blended formulation

| | Formulation A/B |
|---|---|
| DGE-BPA | 23.5 |
| ECE-BPA | 26.6 |
| Anhydride 62C | 36.4 |
| Diacid 1550 | 12.1 |
| DBU | 0.4 |
| Silane A-187 | 1.0 |

In this formulation, the anhydride/total epoxide equivalent weight ratio is 0.89, so that the curing performance can be compared directly with previous epoxy Formulations A and B, which contain a single epoxide monomer. DSC analysis was conducted on the blended Formulation A/B and shows that all of the calorimetric parameters, onset, peak and maximum rate, are intermediate relative to the individual Formulations A and B (Table 7). The reaction enthalpy and glass transition temperature of the blended product A/B was also found to have intermediate values of individual Formulations A and B.

TABLE 7

DSC results for Formulations A, A/B and B: 23-350° C. at 10° C./min.

| | Formulation | | |
|---|---|---|---|
| | A | A/B | B |
| Onset temperature (° C.) | 117 | 129 | 140 |
| Peak temperature (° C.) | 157 | 170 | 185 |
| Temp. at max rate (° C.) | 144 | 155 | 165 |
| Enthalpy (J/g) | 324 | 306 | 238 |
| Tg (° C.) | 89 | 79 | 60 |

Figure 8:
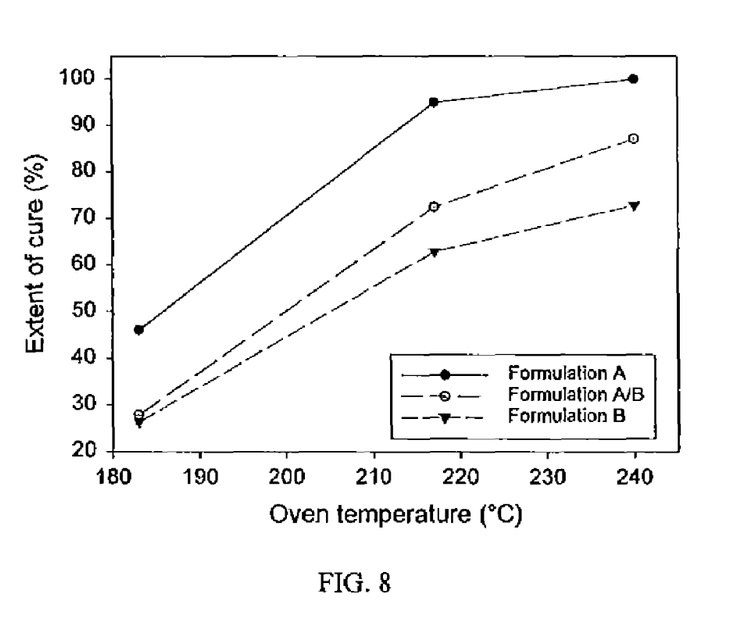
FIG. 8 presents curing profiles of blended A/B formulation and corresponding unblended Formulations A and B.

The extent of curing of the blended Formulation A/B was determined as a function of oven temperature according to the reflow heating program described in Example 7. The results are presented in FIG. 8 and show that the blended product, Formulation A/B, has surprisingly low conversion at 183° C. (Formulations A/B and B have similar conversions), but a conversion that is intermediate between Formulations A and B at 240° C. Thus at temperatures corresponding to maximum fluxing activity the cure is minimized, while at the peak oven temperature after solder has melted, substantial curing is observed. Such a blended product is particularly suitable for high-temperature fluxing underfill adhesives.

The invention claimed is:

1. A combination of an adhesive composition and a silver-based, lead-free solder, comprising
(a) an adhesive composition comprising
(i) the combination of at least one substituted oxirane compound and at least one substituted oxetane compound, and one or more polymerizable co-reactants,
wherein said at least one substituted oxirane compound or substituted oxetane compound comprises the structure:

$\text{E-CH}_2\text{-Q-X}_p\text{—Y—Z}_m\text{—Y}_n\text{—X}_p\text{-Q—CH}_2\text{-E}$ wherein:
each E is independently an oxirane bearing 1, 2, or 3 additional substituents other than H or an oxetane bearing 1, 2, or 3 additional substituents other than H,
each Q is independently selected from the group consisting of —O— and —S—,
each X is optional, and when present, is independently selected from —C(O)— and —SO$_2$—,
each Y is independently an optionally substituted hydrocarbylene,
Z is optional, and when present is selected from the group consisting of —O—, —C(O)—, —S—, —SO$_2$—, hydrocarbylene and substituted hydrocarbylene, and combinations of any two or more thereof,
m=0 or 1,
n=0 or 1, and
each p is independently 0 or 1, and
(ii) optionally, a fluxing agent; and
(b) a silver-based, lead free solder.

2. The composition of claim 1, wherein the hydrocarbylene of Y or Z is selected from the group consisting of alkylene, alkenylene, alkynylene, cycloalkylene, and arylene.

3. The composition of claim 2, wherein arylene is phenylene or naphthylene.

4. The composition of claim 1, wherein each Q is —O—.

5. The composition of claim 4, wherein X is —C(O)—.

6. The composition of claim 4, wherein each Y is —C$_6$H$_4$—.

7. The composition of claim 4, wherein Z is —C(CH$_3$)$_2$—.

8. The composition of claim 1, wherein each of m and n is 0.

9. The composition of claim 1, wherein each of m and n is 1.

10. The composition of claim 1, wherein at least one E has the structure:

wherein:
each of R$^1$-R$^3$ is independently selected from the group consisting of hydrogen, alkyl, substituted alkyl, aryl, and substituted aryl, provided, however, that at least one of R$^1$-R$^3$ is not hydrogen.

11. The composition of claim 10, wherein R$^1$ and R$^3$ are H and R$^2$ is —CH$_3$.

12. The composition of claim 10, wherein R$^1$ is H and each of R$^2$ and R$^3$ are —CH$_3$.

13. The composition of claim 1, wherein at least one E has the structure:

wherein:
R$^4$ is selected from the group consisting of alkyl, substituted alkyl, aryl, and substituted aryl.

14. The composition of claim 13, wherein R$^4$ is —CH$_3$.

15. The composition of claim 1, wherein said co-reactants are epoxy, oxetane, carboxylic acid, anhydride, thiol, amine, or combinations of any two or more thereof.

16. The composition of claim 1, wherein said co-reactants are epoxy.

17. The composition of claim 1, further comprising one or more additional polymerizable components selected from the group consisting of maleimides, cyanate esters, vinyl ethers, (meth)acrylates, and styrenes.

18. The composition of claim 1, further comprising at least one polymerization promoter, and optionally, a filler, toughening agent and/or plasticizer.

19. The composition of claim 1, wherein reaction products of said composition are re-workable.

20. The composition of claim 19, wherein reaction products of said composition are thermally reworkable.

* * * * *